(12) United States Patent
Huang

(10) Patent No.: US 8,043,891 B2
(45) Date of Patent: Oct. 25, 2011

(54) METHOD OF ENCAPSULATING A WAFER LEVEL MICRODEVICE

(75) Inventor: Herb He Huang, Shanghai (CN)

(73) Assignee: Shanghai Lexvu Opto Microelectronics Technology Co., Ltd., Shanghai (CN)

( * ) Notice: Subject to any disclaimer, the term of this patent is extended or adjusted under 35 U.S.C. 154(b) by 0 days.

(21) Appl. No.: 12/793,295

(22) Filed: Jun. 3, 2010

(65) Prior Publication Data

US 2010/0311209 A1     Dec. 9, 2010

Related U.S. Application Data

(60) Provisional application No. 61/184,598, filed on Jun. 5, 2009.

(51) Int. Cl.
*H01L 21/00* (2006.01)
*H01L 21/50* (2006.01)
*H01L 21/48* (2006.01)
*H01L 21/44* (2006.01)

(52) U.S. Cl. ............ 438/106; 438/51; 438/55; 438/124; 438/126; 438/127; 257/E21.499; 257/E21.502; 257/E21.503; 257/E21.598

(58) Field of Classification Search ........... 257/E21.499, 257/E21.502, E21.503, E21.598
See application file for complete search history.

(56) References Cited

U.S. PATENT DOCUMENTS

| | | | |
|---|---|---|---|
| 5,914,507 A * | 6/1999 | Polla et al. ............ 257/254 |
| 5,963,289 A | 10/1999 | Stefanov et al. ............ 349/187 |
| 6,635,509 B1 | 10/2003 | Ouellet ............ 438/106 |
| 6,660,564 B2 | 12/2003 | Brady ............ 438/119 |
| 6,777,767 B2 | 8/2004 | Badehi ............ 257/432 |
| 6,841,861 B2 | 1/2005 | Brady ............ 257/678 |
| 6,953,985 B2 | 10/2005 | Lin et al. ............ 257/659 |
| 6,972,480 B2 | 12/2005 | Zilber et al. ............ 257/678 |
| 7,159,047 B2 | 1/2007 | Klecka et al. ............ 710/10 |
| 7,323,401 B2 | 1/2008 | Ramaswamy et al. ............ 438/551 |
| 7,393,758 B2 | 7/2008 | Sridhar et al. ............ 438/460 |
| 2004/0061207 A1 * | 4/2004 | Ding ............ 257/678 |
| 2006/0110893 A1 * | 5/2006 | Quenzer et al. ............ 438/455 |
| 2006/0255881 A1 * | 11/2006 | Lutz et al. ............ 333/186 |
| 2007/0001287 A1 * | 1/2007 | Bosco et al. ............ 257/704 |
| 2007/0243662 A1 * | 10/2007 | Johnson et al. ............ 438/106 |

* cited by examiner

*Primary Examiner* — Mohsen Ahmadi
(74) *Attorney, Agent, or Firm* — J.C. Patents

(57) ABSTRACT

The present invention discloses a method of encapsulating a wafer level microdevice, which includes: fabricating a microdevice on top side of a first silicon wafer; depositing a first capping carbon film on the top side of the first silicon wafer; implementing a backside fabricating process of wafer from bottom side of the first silicon wafer by carrying the top side of the first silicon wafer through the first capping carbon film; removing the first capping carbon film by selective gaseous reaction with carbon; and encapsulating an encapsulation wafer onto the top side of the first silicon wafer. The present invention deposits and removes the first capping carbon film by means of chemical technology, thereby protecting the microdevice on the top side of the first wafer during implementing the backside fabricating process of wafer. The top side does not need to be protected through the encapsulation wafer before implementing the backside fabricating process of wafer, which makes the wafer thinner and convenient to be handled.

25 Claims, 10 Drawing Sheets

METHOD OF ENCAPSULATING A WAFER LEVEL MICRODEVICE

CROSS-REFERENCE TO RELATED APPLICATIONS

This application claims priority to U.S. Provisional Patent Application No. 61/184,598, filed on Jun. 5, 2009, entitled "METHOD OF FORMING THRU-SILICON VIA AND ENCAPSULATION FOR WAFER LEVEL PACKAGING OF MICRODEVICES", which is hereby incorporated by reference in its entirety.

FIELD OF THE TECHNOLOGY

The present invention relates to a field of encapsulating technology, and particularly to a method of encapsulating a wafer level microdevice forming on a wafer.

BACKGROUND

Many advanced silicon-based microdevices incorporate alternative micro components, such as mechanical, optical, chemical, biological and other types of physical components, with basic microelectronic devices on one silicon substrate, and the silicon substrate could be described as a silicon wafer. And many of such alternative micro components need to be encapsulated in micro to nano scale cavities forming on top of the silicon substrate. Furthermore, such microdevices are preferably fabricated through a unified wafer level fabrication process on the same silicon substrate, from forming microelectronic devices and alternative micro components to forming and encapsulating the micro or nano cavities.

Meanwhile, electrical in-out pads in such microdevices for electrical signal and power transmission with such microdevices, produced on the one side of the silicon substrate, are preferably rerouted to the opposite side of the silicon substrate through so-called through-silicon via interconnects, for reducing the planar size of the microdevices while making ease for encapsulation and cavity formation and if necessary, enabling 3-dimensional packaging by bonding and stacking another silicon substrate. Due to substantial mechanical handling and potential damage issues on such a silicon wafer on the top side of which microelectronic and alternative micro components, containing micro to nano scale cavities, are readily formed, further fabricating through-silicon via interconnects to the bottom side and meanwhile encapsulating the top side of the silicon wafer is substantially difficult and still remains of substantial issues in the prior art.

Therefore robust and practical wafer level fabrication methods are desired for non-invasively forming through-silicon via from the backside of a silicon wafer and encapsulation of the microelectronic and alternative micro components previously fabricated on the top side of the silicon wafer. One typical class of such methods includes the following basic sequential steps: 1) first mechanically attaching a protective film, for example a resin film, onto the micro components upon fabrication on the top side of the silicon wafer; 2) processing the through-silicon via and interconnects from the back side of the silicon wafer; 3) mechanically detaching the protective film attaching on the top side; and 4) encapsulating the micro components on the top side of the silicon wafer. Such basic method of this class is widely used for backside grinding and thinning of conventional semiconductor wafers upon fabricating microelectronic devices on the top side. However the mechanical attachment and detachment of the protective film relative to the top side of the silicon wafer, containing alternative micro components to the conventional microelectronic devices, lead in many cases to inevitable mechanical damage and chemical contamination to those micro components. In particular, any MEMS components suspended above cavities are considerably vulnerable to such mechanical attachment and detachment of such protective film.

Another class of such methods in the prior art consists of the following sequential steps: 1) first encapsulating the micro components and the top side of the silicon wafer; and 2) producing the through-silicon via and interconnects from the backside of the silicon wafer. Although this would provide physical protection of the fabricated micro components on the top side from potential mechanical damage and chemical contamination during the backside thinning and fabrication of through-silicon via and interconnects, dramatic increase in the wafer stack thickness, typically 2 times the standard silicon wafer thickness, would lead to the wafer handling issue during the backside wafer processing for thinning and through-silicon via formation. If the top encapsulation is very delicate for particular optical consideration, such an extensive backside wafer processing remains as an issue at stake among others.

SUMMARY

The subject of the present invention is to provide a method of encapsulating a wafer level microdevice, so as to provide protection to the microdevice on the wafer and handling the wafer conveniently during implementing a backside fabricating process of wafer.

Embodiments of the present invention provide a method of encapsulating a wafer level microdevice. The method includes the following steps:

fabricating a microdevice on top side of a first silicon wafer;

depositing a first capping carbon film on the top side of the first silicon wafer to cover the microdevice;

implementing a backside fabricating process of wafer from bottom side of the first silicon wafer by carrying the top side of the first silicon wafer through the first capping carbon film;

removing the first capping carbon film by selective gaseous reaction with carbon; and encapsulating an encapsulation wafer onto the top side of the first silicon wafer.

In the method of encapsulating a wafer level microdevice provided by the present invention, the first capping carbon film is deposited by means of chemical technology, thereby protecting the microdevice on the top side of the wafer during implementing the backside fabricating process of wafer. Such method could avoid inevitable mechanical damage and chemical contamination to the microdevice caused by the backside fabricating process. The first capping carbon film is removed by means of chemical technology after accomplishing the backside fabricating process of wafer. The technical solution provided in the present invention is to implement the backside fabricating process of wafer firstly and then encapsulate the top side. Since the first capping carbon film is taken as a sacrificial protective film, the top side of the first wafer does not need to be protected through encapsulating the encapsulation wafer on the top side of the first wafer before implementing the backside fabricating process of wafer, which makes the wafer thinner and convenient to be handled during implementing the backside fabricating process of wafer.

DETAILED DESCRIPTION

In order to make the objects, technical solutions and merits of the present invention clearer, a further detailed description of embodiments of the present invention is given by reference to accompanying drawings.

On top side of a wafer, one or more capped cavities need to be formed to encapsulate microdevices. For many specialized applications, a capped cavity is built and side-sealed by surrounding walls or predefined sealing grids for separating the top side or the microdevice from an encapsulation wafer. One of such applications is optical imaging using CMOS photoelectronic components, such as CIS(CMOS Imaging Sensor) built into the microdevice and another, reflective spatial light modulation using liquid crystal or liquid crystal on silicon (LCOS), both requiring the encapsulation wafer to be optically transparent to visible light. And for LCOS application, the capped cavity is further filled with a liquid crystal. For another class of applications in micro-electrical-mechanical systems (MEMS), the microdevice further contains a suspended structural film above the top side also encapsulated into the capped cavity. And the capped cavity may be filled with various fluids for different applications; the filling fluids include liquids such as water besides liquid crystal, and gases such as any one or combination of hydrogen, nitrogen, helium and argon gases.

Embodiment One

Figure 1:
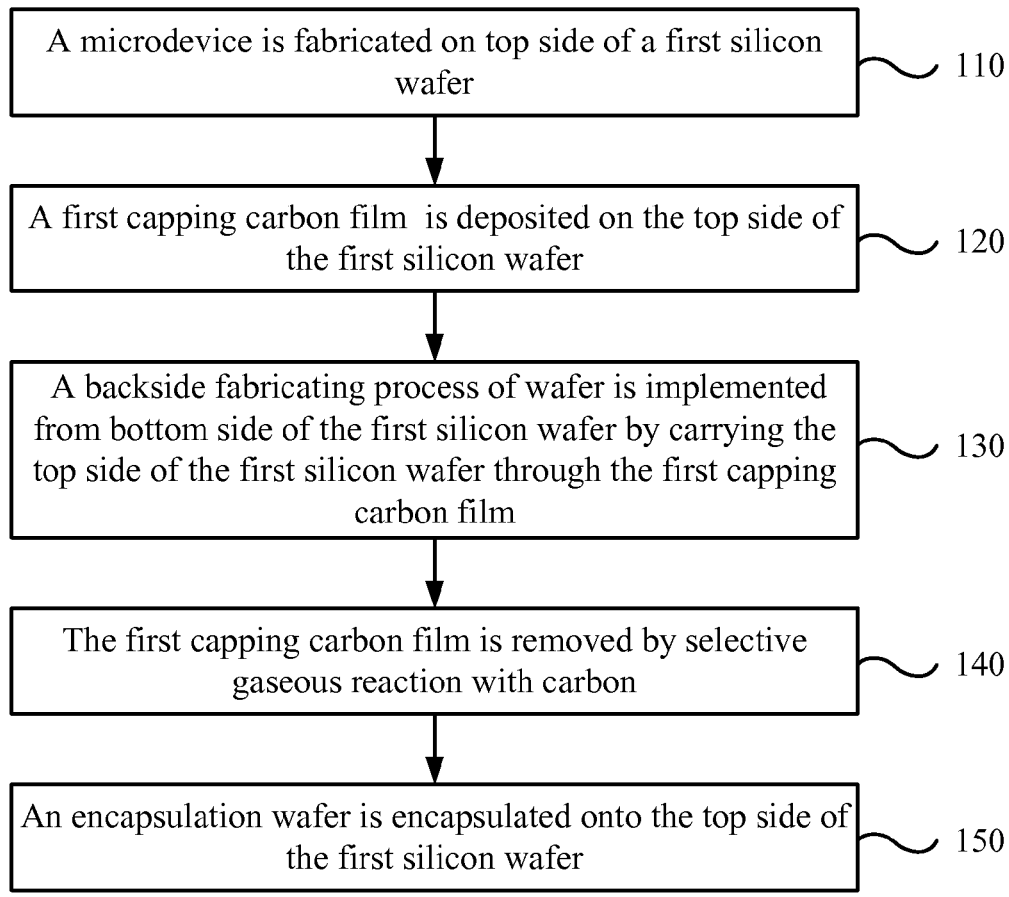
FIG. 1 is a flow chart of a method of encapsulating a wafer level microdevice in accordance with Embodiment One of the present invention.

FIG. 1 is a flow chart of a method of encapsulating a wafer level microdevice in accordance with Embodiment One of the present invention, which shows a basic process of encapsulating a microdevice in the present invention. Also for simplification without losing generality of the principal methodology, the illustration and supporting description omit a number of trivial processing steps which are common and obvious in the context of silicon wafer level microelectronic fabrication. The method of the present embodiment includes the following steps:

In step 110, a microdevice 13 is fabricated on top side 11 of a first silicon wafer 10.

Figure 2A:
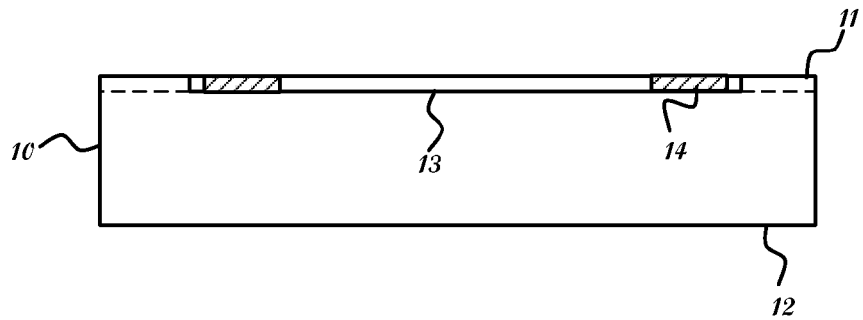
FIGS. 2a-2e are schematic partial structural views of a microdevice fabricated in the Embodiment One of the present invention.

The first silicon wafer 10 is taken as a silicon substrate, and the microdevice 13 could be fabricated through processing methods disclosed in the prior art and/or in industrial practice. Generally, a plurality of microdevices 13 may be fabricated, and the microdevices are arranged as a planar array. FIG. 2a is one of schematic partial structural views of the microdevice fabricated in the Embodiment One of the present invention. The structure of one integrate microdevice 13 is shown in FIG. 2a, and other microdevices 13 are similar. The method for encapsulating the microdevice 13 is indicated without losing generality. The microdevice 13 fabricated on the top side 11 of the first silicon wafer 10 may contain a top in-out pad 14 for providing electrically connection with an external system. May be each os microdevices 13 contains one top in-out pad 14 respectively, or may be part of microdevices 13 or the microdevice 13 at edge contain one top in-out pad 14 respectively.

Figure 2B:
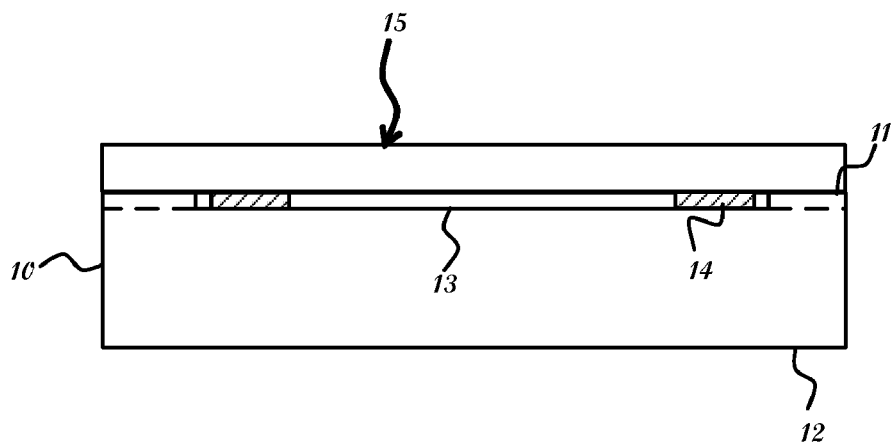

In step 120, a first capping carbon film 15 is deposited on the top side 11 of the first silicon wafer 10 to cover the microdevice 13, as shown in FIG. 2b. That is to completely cover the top side 11 of the first silicon wafer 10 provided with the microdevice 13, and the first silicon wafer 10 is taken as a temporary protective film to avoid mechanical handling damage and other chemical or physical impact during fabricating the wafer, particularly during implementing a necessary backside fabricating process of wafer. Compared to other solid polymeric films such as resin, a carbon film is more robust in mechanical and physical properties and more compatible to semiconductor wafer fabrication practice, as it is widely used as an ashable hard mask. The first capping carbon film 15 may be comprises less than 9 percent of hydrogen.

In step 130, a backside fabricating process of wafer is implemented from bottom side 12 of the first silicon wafer 10 by carrying the top side 11 of the first silicon wafer 10 through the first capping carbon film 15.

When the backside fabricating process of wafer needs to be implemented from the bottom side 12 of the first silicon wafer 10, the first silicon wafer 10 generally needs to be reversed up-down and the original top side 11 of the first silicon wafer 10 is reversed towards the bottom, so as to operate on the original bottom side 12 of the first silicon wafer 10.

The backside fabricating process of wafer has many particular embodiments. Regarding a top in-out pad 14 included in the microdevice 13, it is desired to fabricate a pad from the bottom side 12 of the silicon wafer, so as to minimize the area of the top side 11. Then, there is a need to form a bottom in-out pad 16, and two corresponding pads could be electrically connected by a through-silicon via 17 and a through-silicon via interconnect 18 respectively. The through-silicon via 17 is formed from the bottom side 12 of the wafer that is taken as an example of the present embodiment to be described in detail.

Figure 2C:
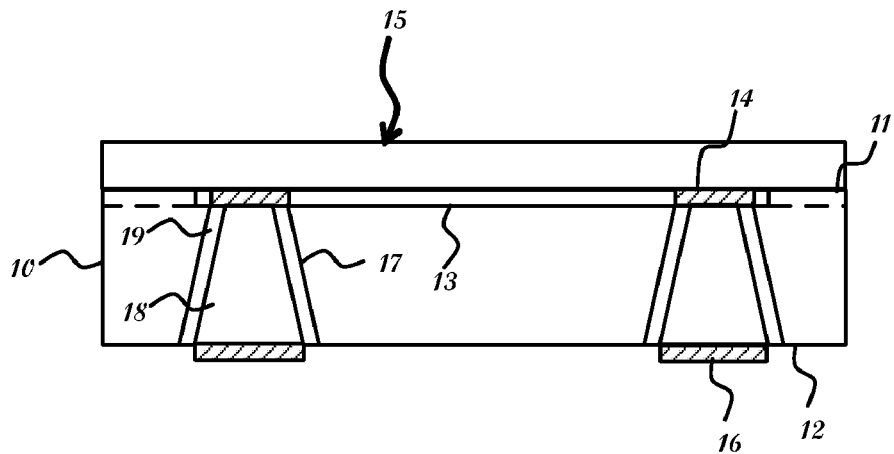

In the step 130, the step of implementing the backside fabricating process of wafer from the bottom side 12 of the first silicon wafer 10 particularly comprises the following steps:

In step 131, fabricating a through-silicon via 17 from the bottom side 12 of the first silicon wafer 10 at stop of the top in-out pad 14, as shown in FIG. 2c. Each through-silicon via 17 at stop of each top in-out pad 14 is aligned with each top in-out pad 14, so as to minimize the area occupied in the top side 11 and keep a perpendicularly connection between the top and bottom in-out pads.

The through-silicon via may be produced by means of any one or combination of wet silicon etching process and dry silicon etching process. Typical silicon wet processes, preferably anisotropic silicon wet etching processes such as KOH wet etching, are applicable for this purpose. Deep reactive ion etching (DRIE) is also applicable process for this purpose in the dry etching category.

In step 132, a through-silicon via insulator 19 is produced. Each through-silicon via insulator 19 could be produced through typical silicon wafer processing practice to at least cap side wall of each through-silicon via 17. The through-silicon via insulator 19 may be made from any one or combination of silicon oxide, silicon nitride, metal oxides and metal nitrides. The through-silicon via insulator 17 could provide electrical insulation to each top in-out pad 14, each interconnect 18 and each bottom in-out pad 16 formed subsequently with the first silicon wafer 10 made of semiconductor. The through-silicon via insulator 17 could further provide physical buffer to the bulk silicon of the first silicon wafer 10.

In step 133, a through-silicon via interconnect 18 is fabricated in the through-silicon via 17 to connect to the top in-out pad 14.

Figure 2D:
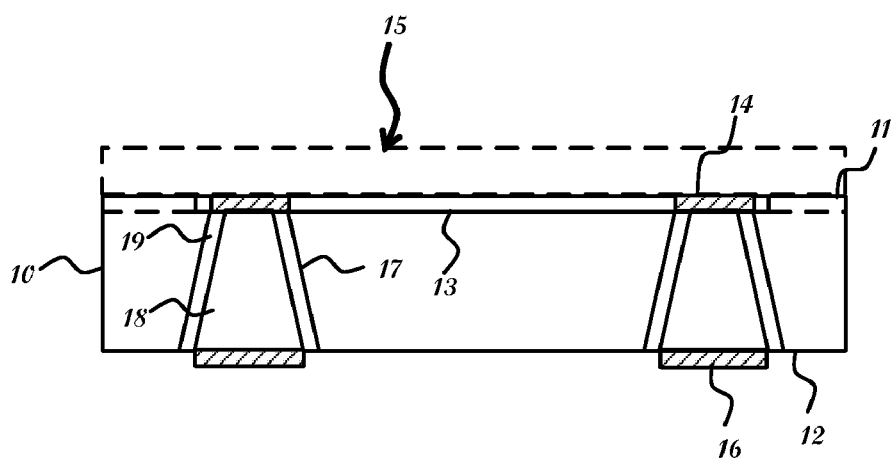

In step 134, a bottom in-out pad 16 is then readily produced through typical thin film metal interconnect fabrication processes, so as to connect with the top in-out pad 14 by passing the through-silicon via interconnect 18 respectively, as shown in FIG. 2c. The pads may be made from aluminum, copper, titanium, tantalum, zinc, lead, tin, silver and/or gold among others After accomplishing the backside fabricating process of wafer, the following steps are executed:

In step 140, the first capping carbon film 15 is removed by selective gaseous reaction with carbon, as shown in FIG. 2d, preferably enhanced via plasma. The first capping carbon film 15 may be removed by means of carbon oxidation or carbon nitrification in a reactor chamber enhanced by containing plasma generated with a plasma source power, so as to re-expose the microdevice 13.

Figure 2E:
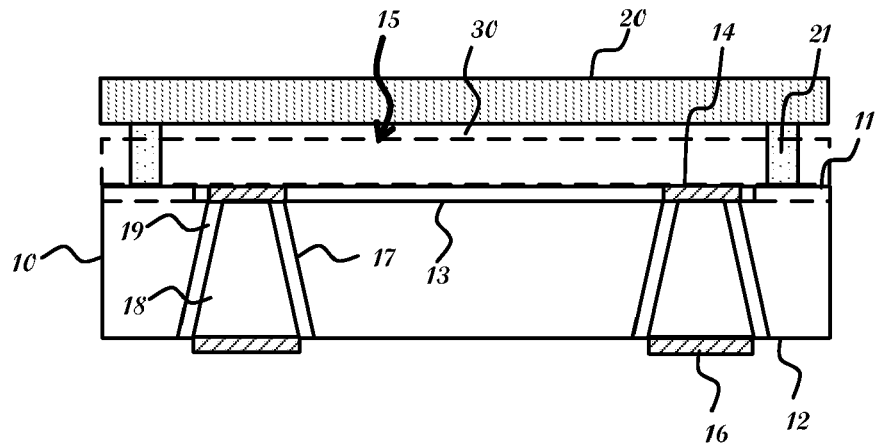

In step 150, an encapsulation wafer 20 is encapsulated onto the top side 11 of the first silicon wafer 10, as shown in FIG. 2e. In FIG. 2e, the position of the removed first capping carbon film 15 is shown by broken line. The microdevice 13 could be encapsulated by the encapsulation wafer 20 with minimum mechanical, chemical or physical impact on the microdevice 13. The encapsulation wafer 20 in the present embodiment may be bonded onto the first silicon wafer 10 by means of sealing grid 21. The sealing grid 21, the first silicon wafer 10 and the encapsulation wafer 20 enclose a capped cavity 30.

In the present embodiment, the first capping carbon film could be deposited by means of chemical technology, thereby protecting the microdevice fabricated on the top side of the wafer during implementing the backside fabricating process of wafer, so as to avoid mechanical damage and chemical contamination caused by the backside fabricating process, and then the first capping carbon film could be removed by means of chemical technology after accomplishing the backside fabricating process of wafer. The technical solution is to implement the backside fabricating process of wafer firstly and then encapsulate the top side of the wafer. Since the first capping carbon film is taken as a sacrificial protective film, the top side of the first wafer does not need to be protected through encapsulating the encapsulation wafer on the top side of the first wafer before implementing the backside fabricating process of wafer. The first capping carbon film preferably as thin as a few to tens of micrometers. The silicon wafer capped on its top side has a thickness close to standard thickness of a silicon wafer, which makes the wafer thinner and convenient to be handled during implementing the backside fabricating process of wafer.

Particularly, similar to a typical method for fabricating a carbon film, the detailed step to depositing the first capping carbon film on the top side of the first silicon wafer could include the following steps.

The first silicon wafer is placed in a reactor chamber.

A carbon-containing process gas is introduced into the reactor chamber, and if needed, a layer-enhancing additive gas is introduced that enhances thermal properties of the first capping carbon film.

A reentrant toroidal RF plasma current is generated in a reentrant path that includes a process zone overlying the first silicon wafer by coupling a plasma RF source power to an external portion of the reentrant path.

RF plasma bias power or bias voltage is coupled to the first silicon wafer, so as to deposit the first capping carbon film on the top side of the first silicon wafer.

Embodiment Two

Figure 3:
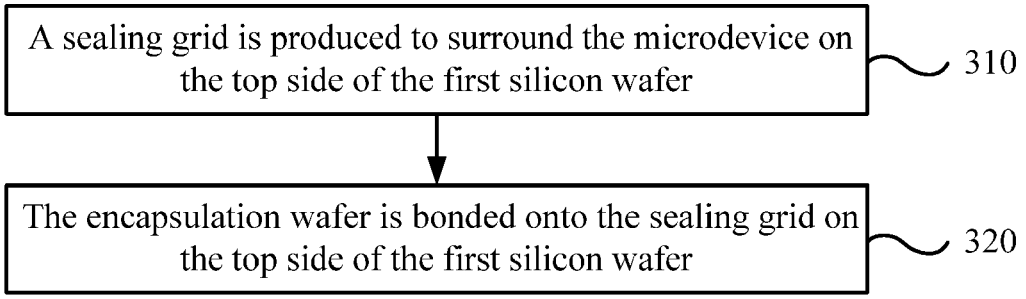
FIG. 3 is a flow chart of a method of encapsulating a wafer level microdevice in accordance with Embodiment Two of the present invention.

FIG. 3 is a flow chart of a method of encapsulating a wafer level microdevice in accordance with Embodiment Two of the present invention. The structure shown in FIG. 2e could be fabricated in various ways, and the present embodiment provides one particular way. The step of encapsulating the encapsulation wafer 20 onto the top side 11 of the first silicon wafer 10 includes the following steps.

Figure 4A:
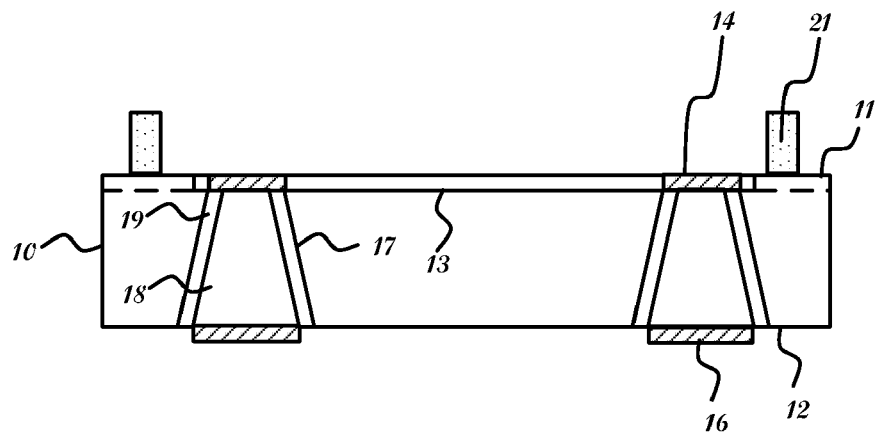
FIGS. 4a and 4b are schematic partial structural views of a microdevice fabricated in the Embodiment Two of the present invention.

In step 310, a sealing grid 21 is produced to surround the microdevice 13 on the top side 11 of the first silicon wafer 10, as shown in FIG. 4a, and the sealing grid 21 provides side wall to a capped cavity 30 formed subsequently.

Figure 4B:
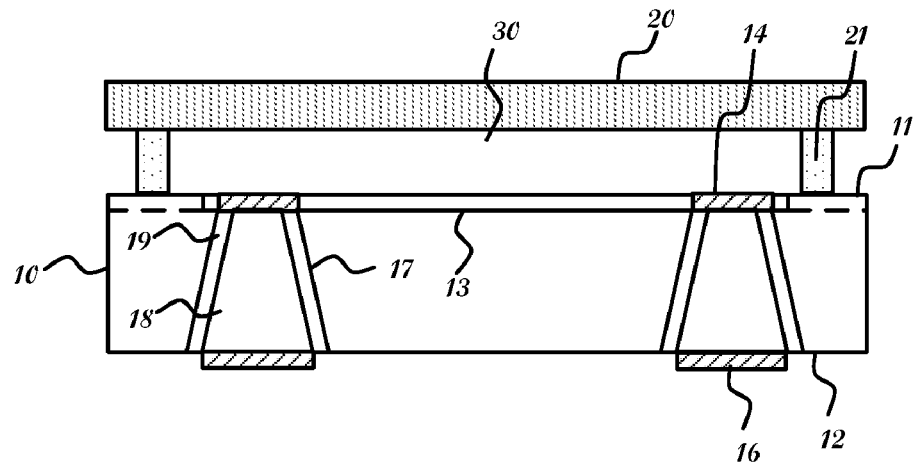

In step 320, the encapsulation wafer 20 is bonded onto the sealing grid 21 on the top side 11 of the first silicon wafer 10. The full closure and hermetic seal capped cavity 30 is enclosed by the encapsulation wafer 20, the sealing grid 21 and the top side 11 of the first silicon wafer 10. Particularly, the bottom side of the encapsulation wafer 20 is taken as a top wall of the capped cavity 30, the top side 11 of the first silicon wafer 10 is taken as a bottom wall of the capped cavity 30, and the sealing grid 21 is side wall. The microdevice 13 is encapsulated into the capped cavity 30, as shown in FIG. 4b. A plurality of capped cavities 30 may be formed to correspond to each of microdevices 13.

The capped cavity is a side sealed cavity by the predefined sealing grid, and may be micro or nano cavity to encapsulate nano-level electronical component, such as micro component fabricated by means of complementary metal oxide semiconductor (CMOS).

Epoxy or silicone based glues are applicable for producing the sealing grid, so as to encapsulated microdevice, which are widely used for wafer level packaging of various practical microelectronic devices as being printable during application and curable for hardening and final bonding to both the encapsulation wafer and the first silicon wafer. Other materials or patternable films are also applicable for producing the predefined sealing grid, including other solid state materials such as silicon oxides as long as enabling such wafer-level bonding and cavity sealing.

Embodiment Three

Figure 5:
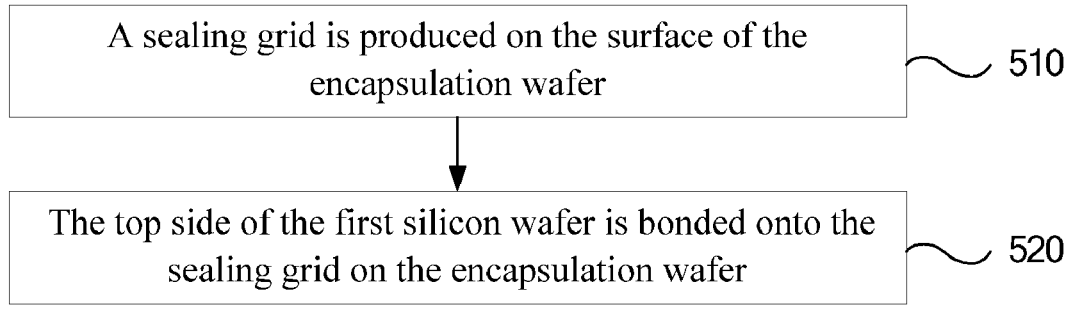
FIG. 5 is a flow chart of a method of encapsulating a wafer level microdevice in accordance with Embodiment Three of the present invention.

FIG. 5 is a flow chart of a method of encapsulating a wafer level microdevice in accordance with Embodiment Three of the present invention. The structure shown in FIG. 2e could be fabricated in various ways, and the present embodiment provides another particular way. The step of encapsulating the encapsulation wafer 20 onto the top side 11 of the first silicon wafer 10 includes the following steps.

Figure 6:
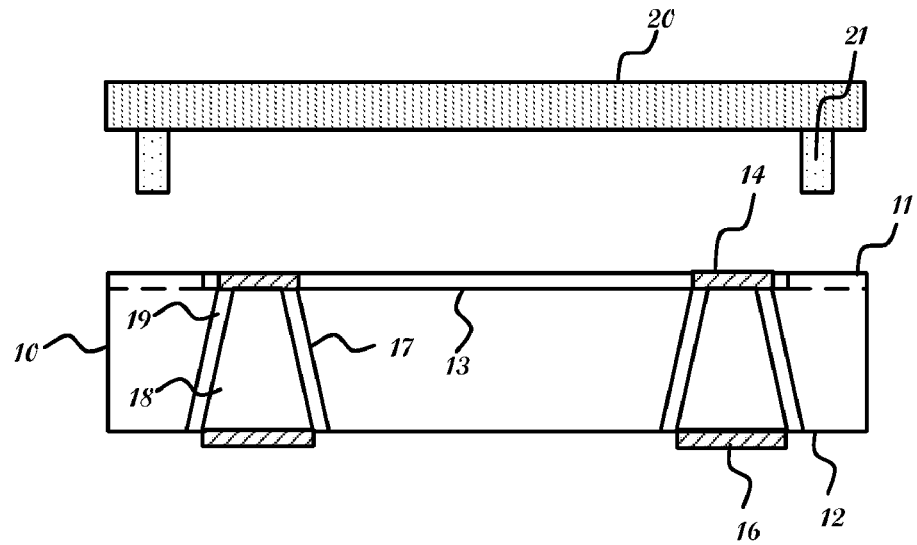
FIG. 6 is a schematic partial structural view of a microdevice fabricated in the Embodiment Three of the present invention.

In step 510, a sealing grid 21 is produced on the surface of the encapsulation wafer 20, as shown in FIG. 6.

In step 520, the top side 11 of the first silicon wafer 10 is bonded onto the sealing grid 21 on the encapsulation wafer 20. A capped cavity 30 is enclosed by the encapsulation wafer 20, the sealing grid 21 and the top side 11 of the first silicon wafer 10, and the microdevice 13 is encapsulated into the capped cavity 30, as shown in FIG. 4b.

Embodiment Four

Figure 7:
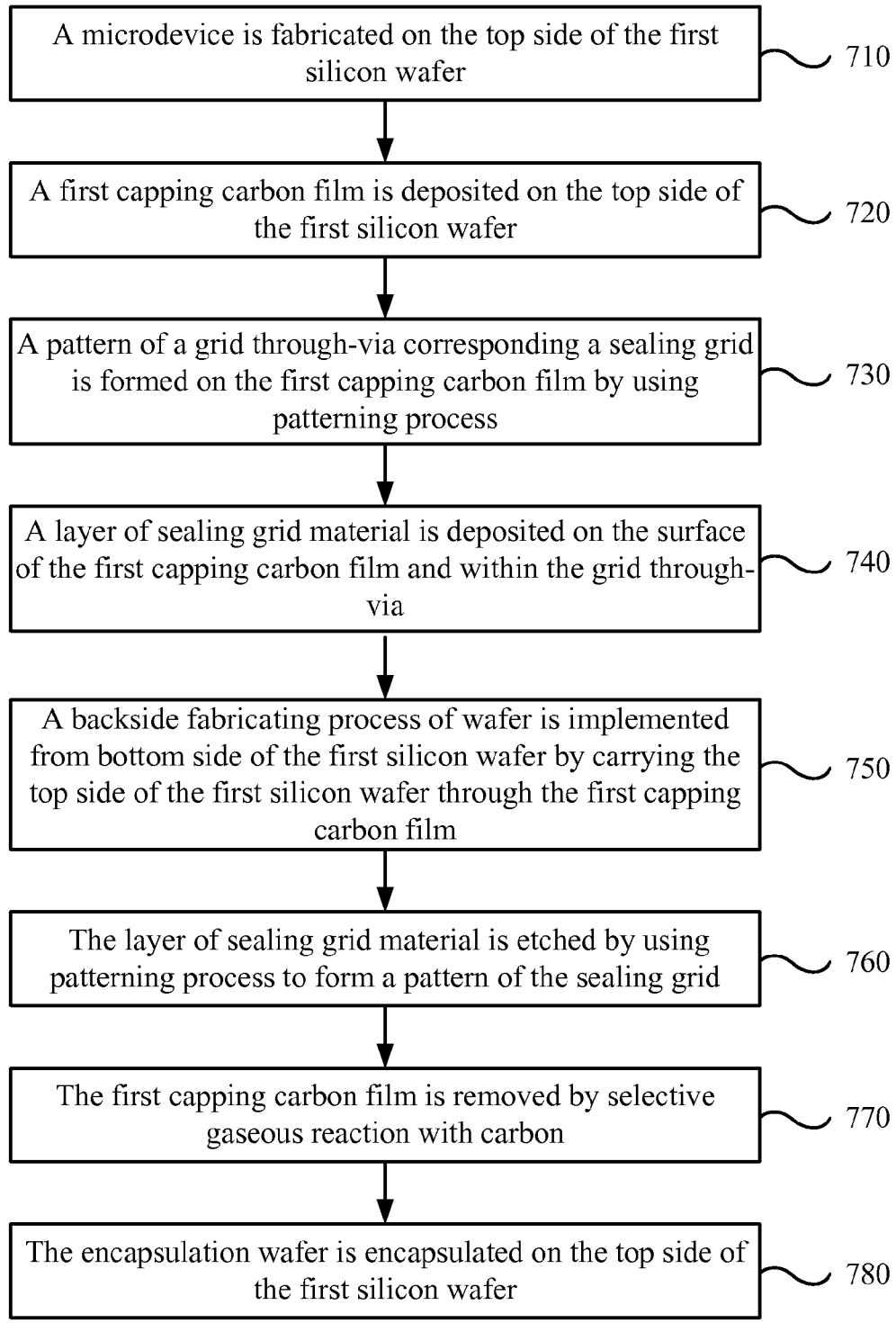
FIG. 7 is a flow chart of a method of encapsulating a wafer level microdevice in accordance with Embodiment Four of the present invention.

FIG. 7 is a flow chart of a method of encapsulating a wafer level microdevice in accordance with Embodiment Four of the present invention. The present embodiment provides another particular way to encapsulating the encapsulation wafer 20 onto the top side 11 of the first silicon wafer 10. The method of encapsulating a wafer level microdevice of the present embodiment includes the following steps.

In step 710, a microdevice 13 is fabricated on the top side 11 of the first silicon wafer 10.

In step 720, a first capping carbon film 15 is deposited on the top side 11 of the first silicon wafer 10 to cover the microdevice 13.

After depositing the first capping carbon film 15 on the top side 11 of the first silicon wafer 10, the following steps are executed.

Figure 8A:
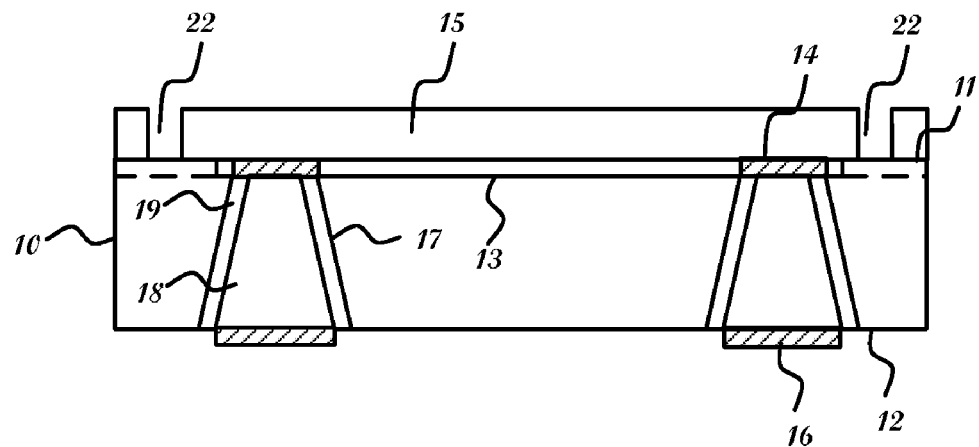
FIGS. 8a-8c are schematic partial structural views of a microdevice fabricated in the Embodiment Four of the present invention.

In step 730, a pattern of grid through-via 22 corresponding to a sealing grid 21 is formed on the first capping carbon film 15 by using patterning process, as shown in FIG. 8a. The position and size of the grid through-via 22 is corresponded to the predefined sealing grid 21.

Figure 8B:
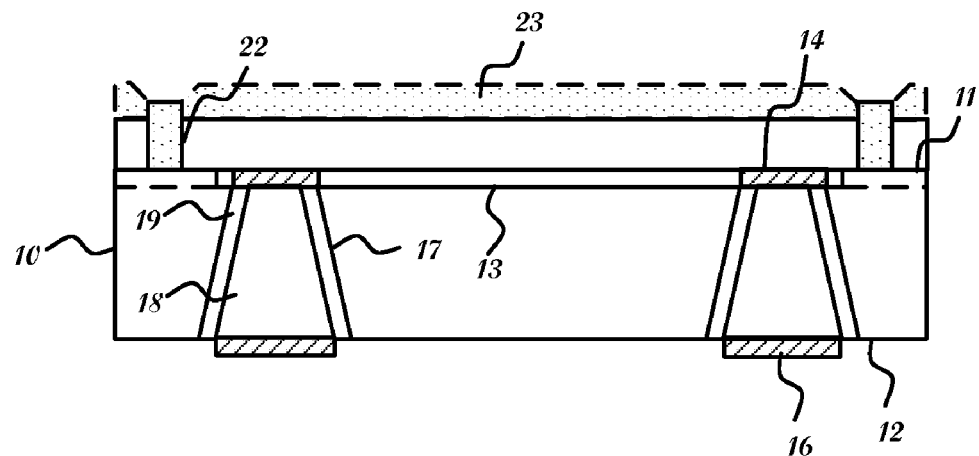

In step 740, a layer of sealing grid material 23 is deposited on the surface of the first capping carbon film 15 and within the grid through-via 22, and the first capping carbon film 15 having the grid through-via 22 and adequate thickness is used as a base cast for the layer of sealing grid material 23, as shown in FIG. 8b.

The step of depositing the layer of sealing grid material is particularly to deposit, by using any one or combination of physical vapor deposition, chemical vapor deposition and liquid-plating deposition, the sealing grid material selected from any one or combination of aluminum, nickel, copper, zinc, lead, silver and gold on the surface of the first capping carbon film and within the grid through-via to form the layer of sealing grid. For example, relatively thick copper pre-defined sealing grid is readily formed via combination of copper seed deposition, etching and copper plating processes and if necessary, chemical mechanical polishing process. The sealing grid may be made from any one of inorganic solid compounds, organic solid compounds and metals. The layer of sealing grid material also may be made of, but not limited to, curable and patternable silicone and epoxies.

In step 750, a backside fabricating process of wafer, for example forming the through-silicon via 17, interconnect 18, insulator 19 and the bottom in-out pad 16 and so on, is implemented from bottom side 12 of the first silicon wafer 10 by carrying the top side 11 of the first silicon wafer 10 through the first capping carbon film 15, as shown in FIG. 8b.

Figure 8C:
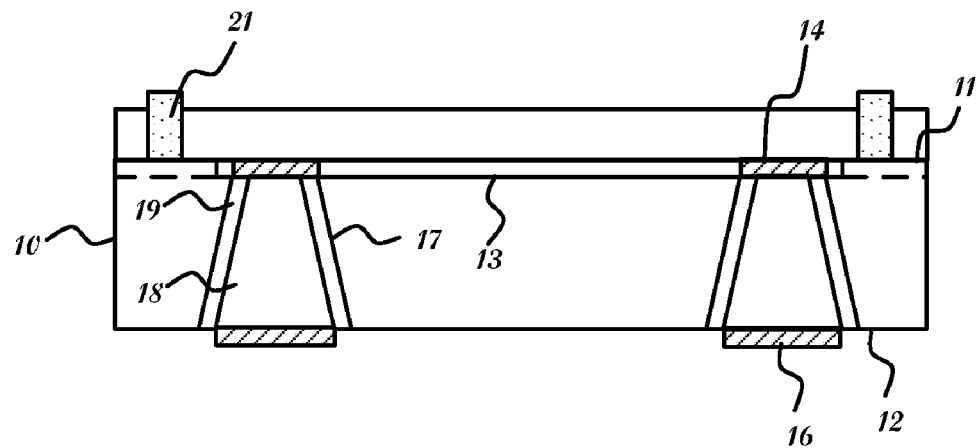

In step 760, the layer of sealing grid material 23 is etched by using patterning process to form a pattern of sealing grid 21, as shown in FIG. 8c. The sealing grid 21 may be formed by etching after forming the through-silicon via 17, insulator 19, interconnect 18 and the bottom in-out pad 16.

The above process is to fabricate the sealing grid by using the first capping carbon film having the grid through-via as a photolithographic hard mask before selectively removing of the first capping carbon film and encapsulating the top side of the microdevice. The above process includes to form the first capping carbon film having the pattern of grid through-via by photolithographic method, deposit the layer of sealing grid material film, and then form the pattern of the sealing grid by the photolithographic method. The sealing grid may be made of conducting material, such as metal, so as to provide electrically connection to the encapsulation wafer and the microdevice on the first silicon wafer.

In step 770, the first capping carbon film 15 is removed by selective gaseous reaction with carbon.

In step 780, the encapsulation wafer 20 is encapsulated on the top side 11 of the first silicon wafer 10. Particularly, the encapsulation wafer 20 is bonded onto the sealing grid 21 on the top side 11 of the first silicon wafer 10, as shown in FIG. 2e.

Embodiment Five

Figure 9A:
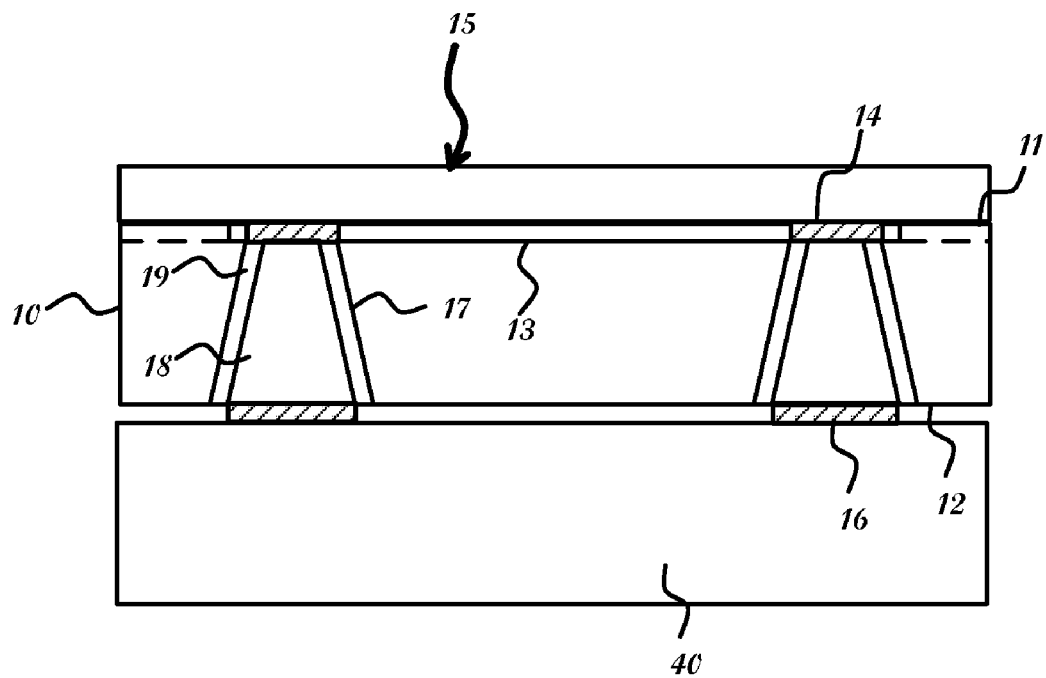
FIGS. 9a and 9b are schematic partial structural views of a microdevice fabricated in the Embodiment Five of the present invention.
Figure 9B:
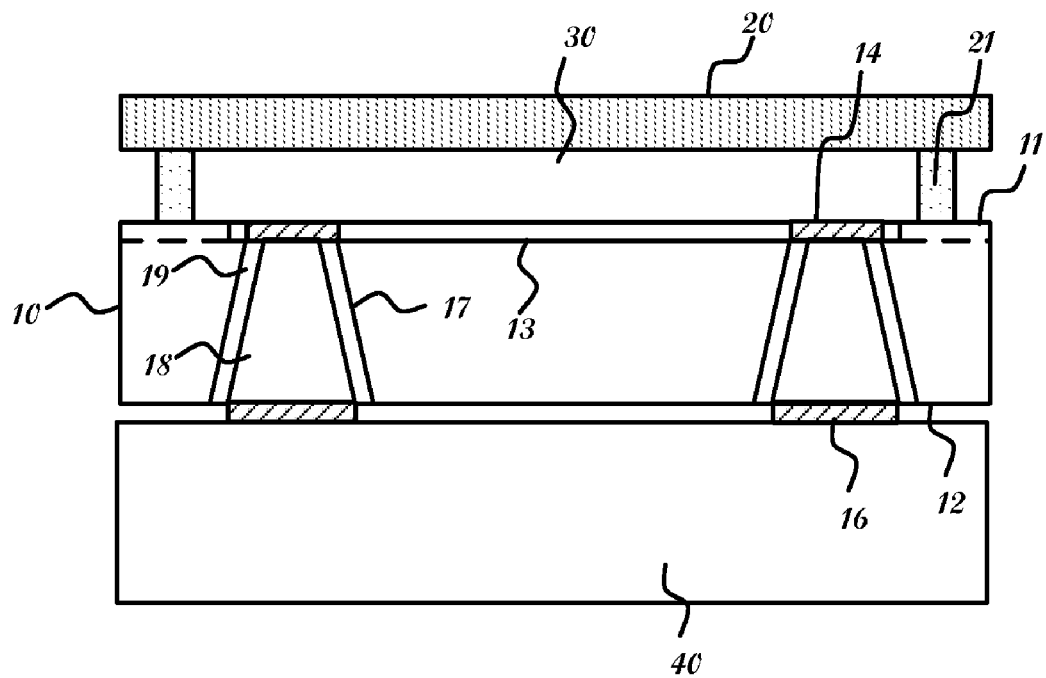

The method of encapsulating the wafer level microdevice provided in the Embodiment Five of the present invention could take the above embodiments as a basic. After implementing the backside fabricating process of wafer from the bottom side of the first silicon wafer, particularly after forming the through-silicon via, insulator, interconnect and the bottom in-out pad, and before removing the first capping carbon film by selective gaseous reaction with carbon, the method further includes to bond the second silicon wafer 40 onto the bottom side 12 of the first silicon wafer 10, as shown in FIG. 9a, and then encapsulate the encapsulation wafer 20 onto the first silicon wafer 10 after removing the first capping carbon film 15, as shown in FIG. 9b.

This configuration allows a three-dimensional wafer level packaging and wafer stacking with encapsulation of the first or most top wafer in a multi-wafer stack containing through-silicon via for trans-wafer electrical interconnection.

Embodiment Six

Figure 10:
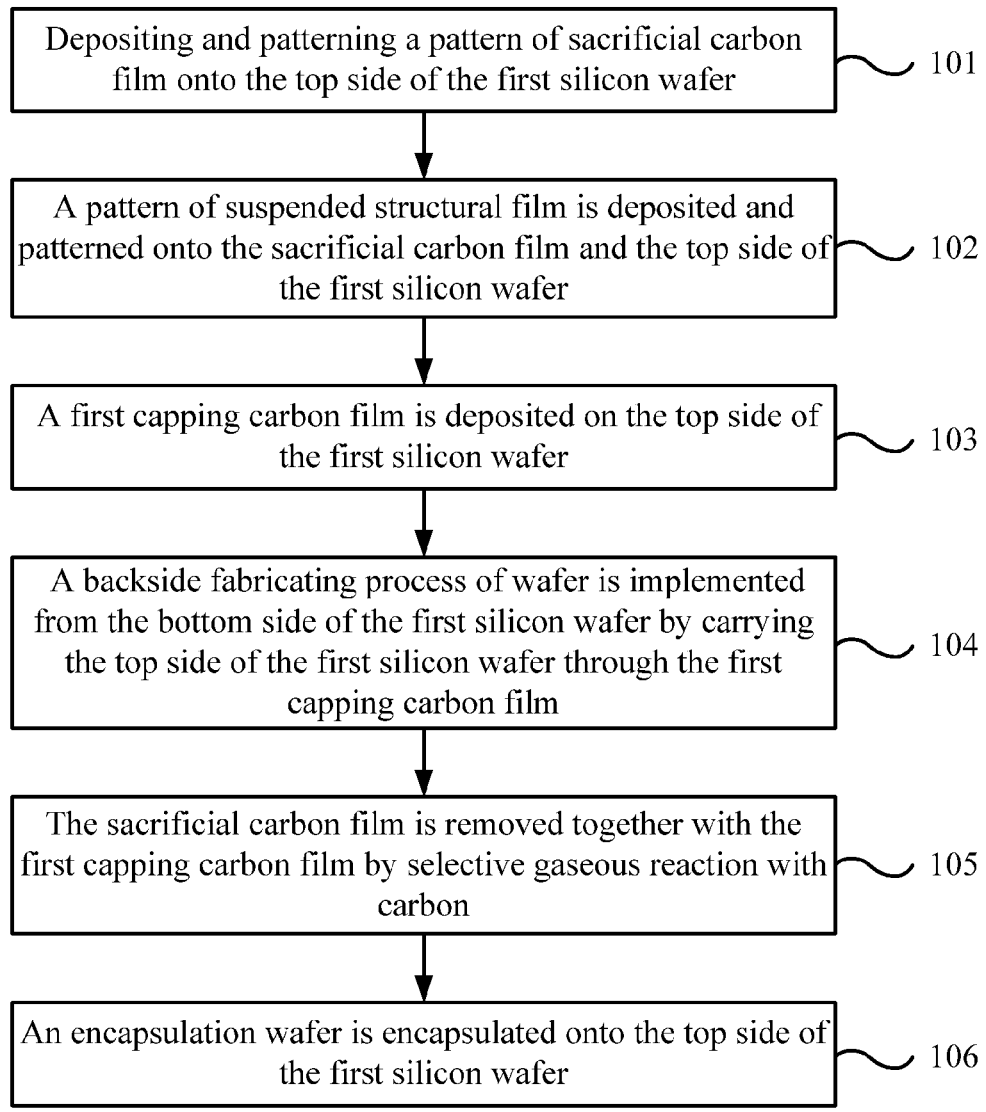
FIG. 10 is a flow chart of a method of encapsulating a wafer level microdevice in accordance with Embodiment Six of the present invention.

FIG. 10 is a flow chart of a method of encapsulating a wafer level microdevice in accordance with Embodiment Six of the present invention. The present embodiment could take the above embodiments as a basic, and forms a suspended structural film 25 according to specific needs. The procedure of fabricating a planar array of microdevices on the first silicon wafer includes the following steps.

In step 101, microdevices 13 are fabricated on the first silicon wafer 10, which particularly includes depositing and patterning a pattern of sacrificial carbon film 24 onto the top side 11 of the first silicon wafer 10. The film may be patterned by using photolithographic method.

Figure 11A:
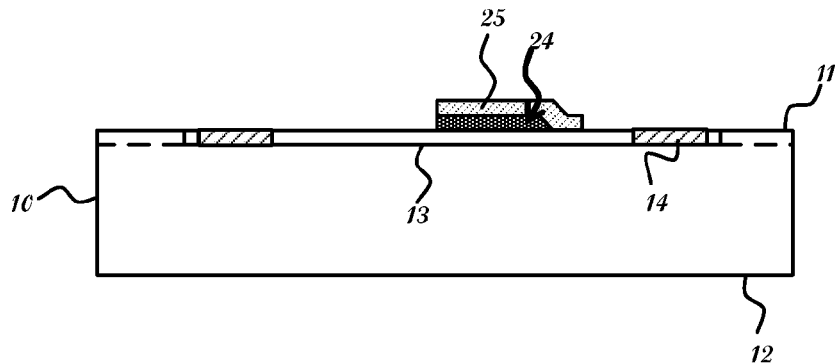
FIGS. 11a-11d are schematic partial structural views of a microdevice fabricated in the Embodiment Six of the present invention.

In step 102, a pattern of suspended structural film 25 is deposited and patterned onto the sacrificial carbon film 24 and the top side 11 of the first silicon wafer 10 to partially expose the sacrificial carbon film 24, as shown in FIG. 11a.

The suspended structural film 25 may be composed of a single or multiple layers of different solid state materials through a sequence of film deposition processes commonly used in semiconductor wafer fabrication, for example, physical vapor deposition (PVD) or chemical vapor deposition (CVD), on top of remaining portion of the sacrificial carbon film 24 and the top side 11 of the first silicon wafer 10.

The deposited layers are then lithographically patterned using photoresist (or in combination with other materials) as the etch mask, by one or multiple steps of etch processing with high etch selectivity over the remaining sacrificial carbon film 24.

In step 103, a first capping carbon film 15 is deposited on the top side 11 of the first silicon wafer 10, to cover the sacrificial carbon film 24 and suspended structural film 25 together with the microdevices 13.

Figure 11B:
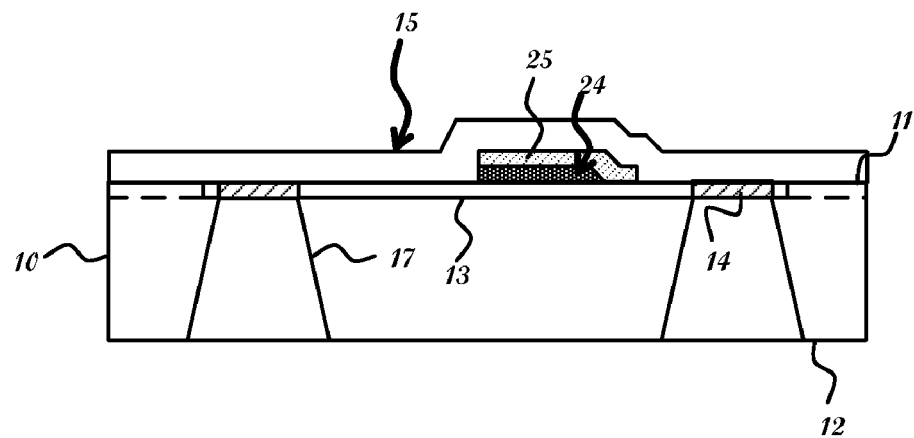

In step 104, a backside fabricating process of wafer is implemented from the bottom side 12 of the first silicon wafer 10 by carrying the top side 11 of the first silicon wafer 10 through the first capping carbon film 15, as shown in FIG. 11b.

Figure 11C:
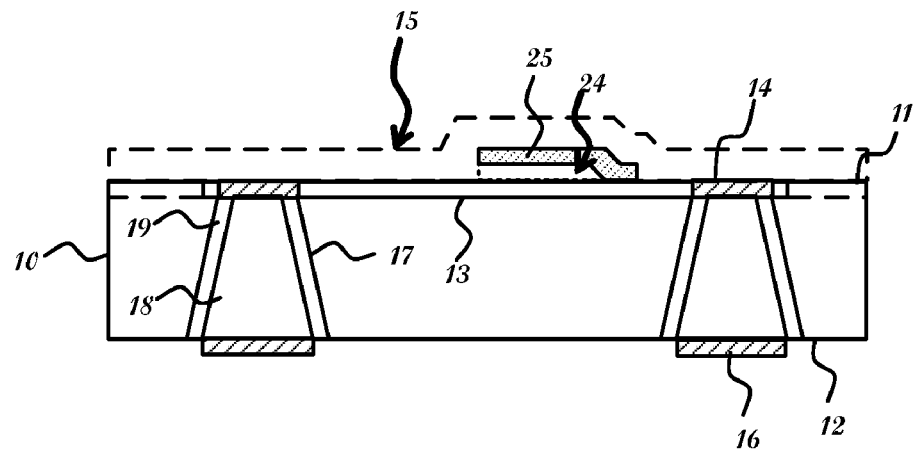

In step 105, the sacrificial carbon film 24 is removed together with the first capping carbon film 15 by selective gaseous reaction with carbon, so as to make the suspended structural film 25 be suspended on the top side 11 of the first silicon wafer 10, as shown in FIG. 11c.

Figure 11D:
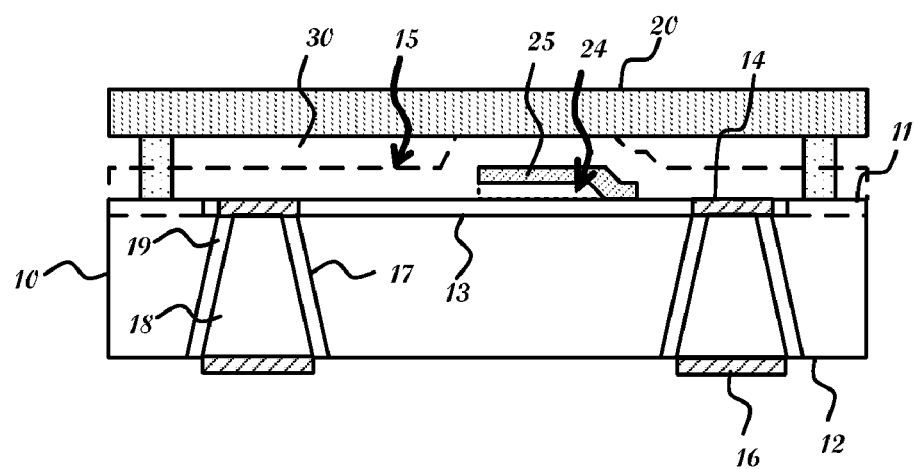

In step 106, an encapsulation wafer 20 is encapsulated onto the top side 11 of the first silicon wafer 10, as shown in FIG. 11d.

The suspended structural film may be made of any one or combination of metals, oxides, nitrides and carbides.

The sacrificial carbon film is sandwiched between the suspended structural film and the top side of the first silicon wafer. The first capping carbon film is deposited onto the suspended structural film, the microdevices and the top side of the first silicon wafer before implementing the backside fabricating process of wafer. Both the sacrificial carbon film and the first capping carbon film are selectively removed with oxidation or nitridation etch process, for releasing the suspended structural film to be suspended. The suspended structural film is encapsulated in the capped cavity. A number of such solid state materials are available to be used for forming such a suspended structural film and performing desired mechanical, optical and/or chemical functions, including but not limited to: polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide, gold and platinum. Certain carbides are also potential candidates containing less than 60 percent of carbon, such as silicon carbide, tungsten carbide, aluminum carbide, and carbon nitride.

Embodiment Seven

The method of encapsulating a wafer level microdevice in accordance with the Embodiment Seven in the present invention could take the above embodiments as a basic. After implementing the backside fabricating process of wafer from the bottom side of the first silicon wafer, and before removing the first capping carbon film by selective gaseous reaction with carbon, the method further includes to deposit a second capping carbon film on the bottom side of the first silicon wafer. The second capping carbon film is removed together with the first capping carbon film by selective gaseous reaction with carbon, or the second capping carbon film may be removed independently by selective oxidation or nitridation, so as to minimize the affect on the top side.

Through forming the second capping carbon film on the bottom side of the first silicon wafer before removing the first capping carbon film from the top side, the bottom side of the first silicon wafer could be protected, thereby avoiding process damage or contamination on the top side.

Embodiment Eight

Figure 12:
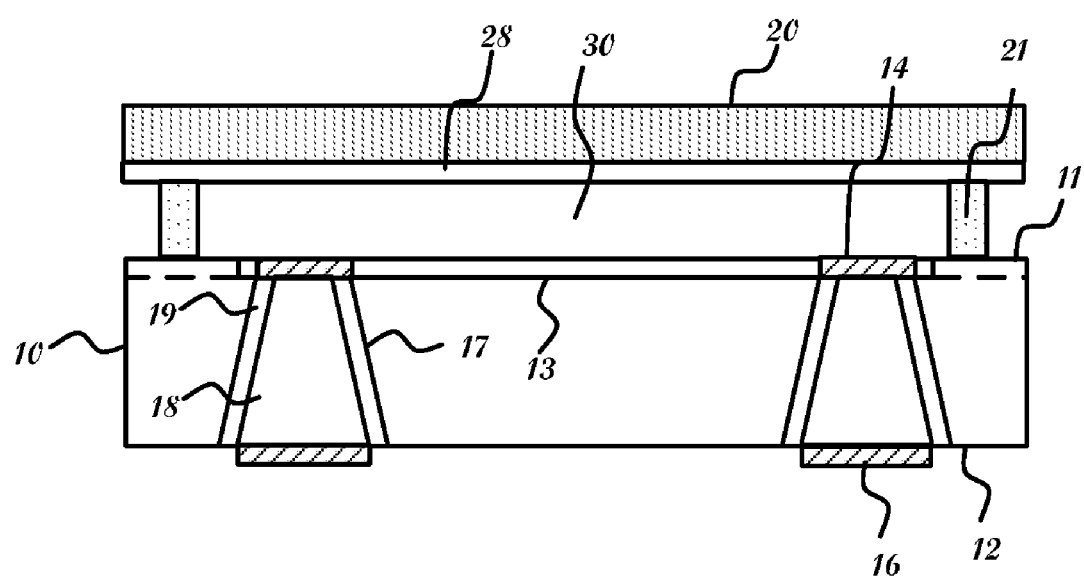
FIG. 12 is a schematic partial structural view of a microdevice fabricated in the Embodiment Eight of the present invention.

The method of encapsulating a wafer level microdevice in accordance with the Embodiment Eight in the present invention could take the above embodiments as a basic, and further includes depositing electrically conductive and optically transparent coating film 28 on the encapsulation wafer 20, as shown in FIG. 12. The coating film 28 is formed on the encapsulation wafer 20 and towards the first silicon wafer 10.

The sealing grid is electrically conductive providing means for electrically connecting the coating film and the microdevice of the first silicon wafer. The coating film 28 may be made of indium tin oxide (ITO). The ITO is deposited on the encapsulation wafer 20 before the encapsulation wafer 20 is bonded onto the first silicon wafer 10.

This structure is typically suitable to LCOS application. Preferably, the sealing grid is made of conductive material, and provides means for electrically connecting the electrically conductive and optically transparent coating and the microdevice of the first silicon wafer.

Regarding the wafer level microdevice having the formed capped cavity, in embodiments of the present invention, after removing the first capping carbon film, the capped cavity could be filled with a filling fluid. The filling fluid may be any one or combination of hydrogen, nitrogen, helium and argon gases, or the filling fluid is liquid crystal. In another application, the filling fluid may contain water.

The method of encapsulating the wafer level microdevice provided in the present invention could be used widely, and used in a variety of encapsulated IC and MEMS structures. Besides using dielectric substance, the encapsulation wafer also may be at least partially transmissive to electromagnetic waves for others different need.

Finally, it should be noted that the above embodiments are merely provided for describing the technical solutions of the present invention, but not intended to limit the present invention. It should be understood by those of ordinary skill in the art that although the present invention has been described in detail with reference to the foregoing embodiments, modifications can be made to the technical solutions described in the foregoing embodiments, or equivalent replacements can be made to some technical features in the technical solutions, as long as such modifications or replacements do not cause the essence of corresponding technical solutions to depart from the spirit and scope of the present invention.

What is claimed is:

1. A method of encapsulating a wafer level microdevice comprising:

a step of fabricating the wafer level microdevice on a top side of a first silicon wafer comprises:

depositing and patterning a pattern of a sacrificial carbon film on the top side of the first silicon wafer;

depositing and patterning a pattern of a suspended structural film onto the sacrificial carbon film and the top side of the first silicon wafer to partially expose the sacrificial carbon film;

depositing a first capping carbon film on the top side of the first silicon wafer including the sacrificial carbon film and the suspended structural film to cover the wafer level microdevice; and removing the sacrificial carbon film together with the first capping carbon film by selective gaseous reaction with carbon, so as to make the suspended structural film be suspended on the top side of the first silicon wafer including the wafer level microdevice;

implementing a backside fabricating process of the first silicon wafer from a bottom side of the first silicon wafer by carrying the top side of the first silicon wafer through the first capping carbon film; and a step of encapsulating an encapsulation wafer onto the top side of the first silicon wafer comprises at least one of: producing a sealing grid surrounding the wafer level microdevice on the top side of the first silicon wafer; and encapsulating the wafer level microdevice into a capped cavity enclosed by the encapsulation wafer, the sealing grid and the top side of the first silicon wafer, by bonding the encapsulation wafer onto the sealing grid on the top side of the first silicon wafer, or producing the sealing grid on a surface of the encapsulation wafer; and encapsulating the wafer level microdevice into the capped cavity enclosed by the encapsulation wafer, the sealing grid and the top side of the first silicon wafer, by bonding the top side of the first silicon wafer onto the sealing grid on the encapsulation wafer.

2. The method according to claim 1, wherein the wafer level microdevice fabricated on the top side of the first silicon wafer comprises a top in-out pad, and the step of implementing the backside fabricating process of wafer from the bottom side of the first silicon wafer comprises:

fabricating a through-silicon via from the bottom side of the first silicon wafer at stop of the top in-out pad;

producing a through-silicon via insulator capping side wall of the through-silicon via;

fabricating a through-silicon interconnect in the through-silicon via to connect to the top in-out pad;

producing a bottom in-out pad connected to the top in-out pad via the through-silicon interconnect.

3. The method according to claim 2, wherein the through-silicon via is produced by means of any one or combination of wet silicon etching process and dry silicon etching process.

4. The method according to claim 2, wherein the through-silicon via insulator is made from any one or combination of silicon oxide, silicon nitride, metal oxides and metal nitrides.

5. The method according to claim 1, wherein after depositing the first capping carbon film on the top side of the first silicon wafer, the method further comprises: forming a pattern of grid through-via corresponding to the sealing grid on the first capping carbon film by using patterning process; and depositing a sealing grid material on a surface of the first capping carbon film and within the grid through-via;

after implementing the backside fabricating process of the first silicon wafer, and before removing the first capping carbon film, the method further comprises: etching a layer of the sealing grid material by using patterning process to form the pattern of sealing grid; and after removing the first capping carbon film, the step of encapsulating the encapsulation wafer onto the top side of the first silicon wafer comprises: bonding the encapsulation wafer onto the sealing grid on the top side of the first silicon wafer.

6. The method according to claim 5, wherein the step of depositing the sealing grid material on the surface of the first capping carbon film and within the grid through-via comprises:

depositing, by using any one or combination of physical vapor deposition, chemical vapor deposition and liquid-plating deposition, the sealing grid material selected from any one or combination of aluminum, nickel, copper, zinc, lead, silver and gold on the surface of the first capping carbon film and within the grid through-via to form the layer of sealing grid.

7. The method according to claim 5, wherein after removing the first capping film, the method further comprises: placing a filling fluid into the capped cavity.

8. The method according to claim 7, wherein the filling fluid is any one or combination of hydrogen, nitrogen, helium and argon gases, or the filling fluid is liquid crystal, or the fluid contains water.

9. The method according to claim 5, wherein the sealing grid is made of any one of inorganic solid compounds, organic solid compounds and metals, or the sealing grid is electrically conductive providing means for electrically connecting the encapsulation wafer and the wafer level microdevice of the first silicon wafer.

10. The method according to claim 1, wherein the step of removing the first capping carbon film by the selective gaseous reaction with the carbon comprises:

removing the first capping carbon film by selective gaseous reaction with the carbon enhanced via plasma.

11. The method according to claim 10, wherein the step of removing the first capping carbon film by the selective gaseous reaction with the carbon comprises:

removing the first capping carbon film by means of carbon oxidation or carbon nitrification in a reactor chamber enhanced by containing plasma generated with a plasma source power.

12. The method according to claim 1, wherein the step of depositing the first capping carbon film on the top side of the first silicon wafer comprises:

placing the first silicon wafer in a reactor chamber;

introducing a carbon-containing process gas into the reactor chamber;

generating a reentrant toroidal RF plasma current in a reentrant path that includes a process zone overlying the first silicon wafer by coupling a plasma RF source power to an external portion of the reentrant path; and coupling RF plasma bias power or bias voltage to the first silicon wafer, so as to deposit the first capping carbon film on the top side of the first silicon wafer.

13. The method according to of claim 1, wherein the first capping carbon film comprises less than 9 percent of hydrogen.

14. The method according to claim 1, wherein after implementing the backside fabricating process of the first silicon wafer from the bottom side of the first silicon wafer, and before removing the first capping carbon film by the selective gaseous reaction with the carbon, the method further comprises: bonding a second silicon wafer on the bottom side of the first silicon wafer.

15. The method according to claim 1, wherein the suspended structural film is made of any one or combination of metals, oxides, nitrides and carbides.

16. The method according to claim 1, wherein after implementing the backside fabricating process of the first silicon wafer from the bottom side of the first silicon wafer, and before removing the first capping carbon film by the selective gaseous reaction with the carbon, the method further comprises:

depositing a second capping carbon film on the bottom side of the first silicon wafer, wherein the second capping carbon film is removed together with the first capping carbon film by the selective gaseous reaction with the carbon.

17. The method according to claim 1, wherein after removing the first capping film, the method further comprises: placing a filling fluid into the capped cavity.

18. The method according to claim 17, wherein the filling fluid is any one or combination of hydrogen, nitrogen, helium and argon gases, or the filling fluid is liquid crystal, or the filling fluid contains water.

19. The method according to claim 1, wherein the sealing grid is made of any one of inorganic solid compounds, organic solid compounds and metals, or the sealing grid is electrically conductive providing means for electrically connecting the encapsulation wafer and the microdevice of the first silicon wafer.

20. The method according to claim 1, wherein the encapsulation wafer is at least partially transmissive to electromagnetic waves.

21. The method according to claim 1, wherein the method further comprises:
depositing electrically conductive and optically transparent coating film on the encapsulation wafer.

22. The method according to claim 21, wherein the coating film is made of indium tin oxide.

23. A method of encapsulating a wafer level microdevice comprising:
a step of fabricating the wafer level microdevice on a top side of a first silicon wafer comprises:
depositing and patterning a pattern of a sacrificial carbon film on the top side of the first silicon wafer;
depositing and patterning a pattern of a suspended structural film onto the sacrificial carbon film and the top side of the first silicon wafer to partially expose the sacrificial carbon film;
depositing a first capping carbon film on the top side of the first silicon wafer including the sacrificial carbon film and the suspended structural film to cover the wafer level microdevice; and
removing the sacrificial carbon film together with a first capping carbon film by selective gaseous reaction with carbon, so as to make the suspended structural film be suspended on the top side of the first silicon wafer including the wafer level microdevice;
wherein a step of depositing the first capping carbon film on the top side of the first silicon wafer to cover the wafer level microdevice comprises:
placing the first silicon wafer in a reactor chamber;
introducing a carbon-containing process gas into the reactor chamber;
generating a reentrant toroidal RF plasma current in a reentrant path that includes a process zone overlying the first silicon wafer by coupling a plasma RF source power to an external portion of the reentrant path; and
coupling a RF plasma bias power or a bias voltage to the first silicon wafer, so as to deposit the first capping carbon film on the top side of the first silicon wafer;
implementing a backside fabricating process of the first silicon wafer from a bottom side of the first silicon wafer by carrying the top side of the first silicon wafer through the first capping carbon film; and
encapsulating an encapsulation wafer onto the top side of the first silicon wafer.

24. The method according to claim 23, wherein the step of encapsulating the encapsulation wafer on the first silicon wafer comprises:
producing a sealing grid surrounding the wafer level microdevice on the top side of the first silicon wafer; and
encapsulating the wafer level microdevice into a capped cavity enclosed by the encapsulation wafer, the sealing grid and the top side of the first silicon wafer, by bonding the encapsulation wafer onto the sealing grid on the top side of the first silicon wafer.

25. The method according to claim 23, wherein the step of encapsulating the encapsulation wafer on the first silicon wafer comprises:
producing a sealing grid on the surface of the encapsulation wafer; and
encapsulating the wafer level microdevice into a capped cavity enclosed by the encapsulation wafer, the sealing grid and the top side of the first silicon wafer, by bonding the top side of the first silicon wafer onto the sealing grid on the encapsulation wafer.

* * * * *